(12) United States Patent
Kamei et al.

(10) Patent No.: US 7,013,415 B1
(45) Date of Patent: Mar. 14, 2006

(54) IC WITH INTERNAL INTERFACE SWITCH FOR TESTABILITY

(75) Inventors: Tatsuya Kamei, Kokubunji (JP); Junichi Nishimoto, Hachioji (JP); Ken Tatezawa, Kodaira (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/979,333

(22) PCT Filed: May 26, 1999

(86) PCT No.: PCT/JP99/02755

§ 371 (c)(1),
(2), (4) Date: Nov. 21, 2001

(87) PCT Pub. No.: WO00/73809

PCT Pub. Date: Dec. 7, 2000

(51) Int. Cl.
*G01R 31/28* (2006.01)

(52) U.S. Cl. .................................................. 714/729
(58) Field of Classification Search ................ 714/729, 714/727, 929
See application file for complete search history.

(56) References Cited

U.S. PATENT DOCUMENTS

| | | | |
|---|---|---|---|
| 4,698,588 A | | 10/1987 | Hwang et al. |
| 5,029,166 A | | 7/1991 | Jarwala et al. |
| 5,412,260 A | * | 5/1995 | Tsui et al. ..................... 326/39 |
| 5,513,187 A | * | 4/1996 | Zepp ........................... 714/727 |
| 5,592,493 A | * | 1/1997 | Crouch et al. ............... 714/729 |
| 5,631,911 A | * | 5/1997 | Whetsel, Jr. ................. 714/727 |
| 5,673,276 A | | 9/1997 | Jarwala et al. |
| 5,805,609 A | * | 9/1998 | Mote, Jr. ..................... 714/726 |
| 6,115,763 A | * | 9/2000 | Douskey et al. ............. 710/72 |
| 6,223,315 B1 | * | 4/2001 | Whetsel ....................... 714/727 |
| 6,266,793 B1 | * | 7/2001 | Mozdzen et al. ........... 714/727 |
| 6,405,335 B1 | * | 6/2002 | Whetsel ....................... 714/726 |
| 6,408,413 B1 | * | 6/2002 | Whetsel ....................... 714/727 |
| 6,425,100 B1 | * | 7/2002 | Bhattacharya .............. 714/724 |
| 6,425,101 B1 | * | 7/2002 | Garreau ....................... 714/727 |

FOREIGN PATENT DOCUMENTS

| | | |
|---|---|---|
| JP | 63-241372 | 10/1988 |
| JP | 64-79834 | 3/1989 |
| JP | 1-112180 | 4/1989 |
| JP | 2-45156 | 10/1990 |

(Continued)

OTHER PUBLICATIONS

IEEE Standard 1149.1-1990 "IEEE Standard Test Access Port and Boundary-Scan Architecture".

*Primary Examiner*—Albert Decady
*Assistant Examiner*—John P. Trimmings
(74) *Attorney, Agent, or Firm*—Mattingly, Stanger, Malur & Brundidge, P.C.

(57) ABSTRACT

A semiconductor integrated circuit which is provided with a shift scan path incorporated in each function module and a testing I/O terminal connected to a shift scan path and provided separately from a normal-operation-use I/O terminal, and which comprises, all formed on one semiconductor chip, a bus interface circuit for connecting normal-operation-use I/O terminals of a plurality of function modules to a bus, an external interface switching circuit which switches between the bus-side I/O terminal of the bus interface circuit and the testing I/O terminal of each function module for connection to an external terminal and an interface control circuit for switch-controlling the external interface switching circuit.

1 Claim, 9 Drawing Sheets

FOREIGN PATENT DOCUMENTS

| | | |
|---|---|---|
| JP | 3-214083 | 9/1991 |
| JP | 3-233375 | 10/1991 |
| JP | 4-15580 | 1/1992 |
| JP | 4-211842 | 8/1992 |
| JP | 4-328475 | 11/1992 |
| JP | 5-72273 | 3/1993 |
| JP | 6-27200 | 2/1994 |
| JP | 6-82529 | 3/1994 |
| JP | 6-94800 | 4/1994 |
| JP | 6-109816 | 4/1994 |
| JP | 7-287053 | 10/1995 |
| JP | 8-50165 | 2/1996 |
| JP | 8-286942 | 11/1996 |
| JP | 9-243709 | 9/1997 |
| JP | 10-246755 | 9/1998 |
| JP | 11-38088 | 2/1999 |

* cited by examiner

IC WITH INTERNAL INTERFACE SWITCH FOR TESTABILITY

TECHNICAL FIELD

The present invention relates to testing techniques in semiconductor integrated circuits (IC: Integrated Circuit), and more particularly to techniques which are effectively applied to testing systems for system LSIs (Large Scale Integration) such as a data processing unit composed of a plurality of function modules, a microprocessor, and a single-chip microcomputer.

BACKGROUND ART

With the advancement of micro-machining technologies, an increasingly larger logical scale of semiconductor integrated circuit can be fabricated on a single semiconductor chip. For this reason, there have been provided semiconductor integrated circuits which have systematic functions fabricated on a single semiconductor chip such as a microprocessor and a single-chip microcomputer (hereinafter also called the "system LSI"), which have conventionally been implemented by a plurality of chips.

When a circuit having a variety of functions such as a central processing unit (CPU), a read only memory (ROM), a random access memory (RAM) is fabricated on a single semiconductor chip, it is efficient to previously determine how respective functions are to be connected to one another, and the functions are separately designed. Then, circuit blocks designed to have such predetermined functions (called the "function module" in this specification) may be registered in a database or the like, such that when a similar semiconductor integrated circuit is developed at a later time, a semiconductor integrated circuit satisfying desired specifications can be provided by selecting and combining modules having desired functions from a plurality of registered modules. For this reason, the utilization of a database as mentioned above is highly effective for reducing a developing period.

In the development of logical integrated circuits such as a data processor, a single-chip microcomputer, and the like, a logic test is conducted in a final stage of the development for verifying that internal logic circuits logically operate as expected (failure detection). For testing a small scale logical integrated circuit, a method can be applied which involves inputting a test pattern and comparing output signals with their expected values. However, for a large scale logical integrated circuit, this method requires an immense number of test patterns, and suffers from a lower failure detection ratio. Therefore, some logical integrated circuits such as a system LSI are provided with a shift-scan based test function.

A shift-scan based test circuit enables a shift register to be built by connecting in series a plurality of flip-flops which comprise a logic circuit. Then, upon testing, test data is scanned into this shift register from an input pin to directly input data into the inside of the logic circuit for forcing it to operate. Then, at a certain point in time, data held in the flip-flops are scanned out to an output pin using the shift register to permit a highly efficient test to be conducted.

PROBLEM TO BE SOLVED BY THE INVENTION

As a test method for a logic integrated circuit comprised of a plurality of function modules, there is also contemplated a method which involves drawing input/output terminals of each module to external terminals and inputting a test pattern to each module for testing. Though this method can advantageously utilize test patterns which have once been created, a problem arises in that the number of terminals is largely increased, resulting in an increase in the chip size.

It is also contemplated to reduce a developing period by providing each function module with a shift-scan based test circuit and reusing once created test patterns in the development of other semiconductor integrated circuits. However, in the technologies for developing a semiconductor integrated circuit by combining a plurality of function modules, a different interface circuit for testing is provided for each semiconductor integrated circuit, in other words, an interface circuit of different specifications is designed for each semiconductor integrated circuit, so that a scan path must also be created again and again for each semiconductor integrated circuit. Therefore, a problem arises in that the developing period is not sufficiently reduced.

It is an object of the present invention to provide a technology which allows for a reduction in the developing period for a semiconductor integrated circuit that is built using a plurality of function modules.

It is another object of the present invention to provide a technique which permits a test to be conducted on each module without increasing the number of external terminals.

The above and other objects and novel features of the present invention will become apparent from the description of the specification and the accompanying drawings.

DISCLOSURE OF THE INVENTION

In the following, representative ones of inventions disclosed in this application will be described in summary.

Specifically, for building a semiconductor integrated circuit such as a system LSI using a plurality of function modules, a shift scan path is incorporated in each function module. Each function module is also provided with input/output terminals for testing, connected to the shift scan path, other than input/output terminals for use in a normal operation. The semiconductor integrated circuit is further provided with a bus interface circuit for connecting the input/output terminals for a normal operation of the plurality of function modules to a bus; an external interface switching circuit for switching input/output terminals of the bus interface circuit on the bus side and the test input/output terminals of each function module for connection to an external terminal; and an interface control circuit for controlling the switching of the external control circuit. These are formed on a single semiconductor chip.

Also, a JTAG interface control circuit defined in IEEE1149.1 standard is utilized as the interface control circuit, and a switching command is provided for controlling the switching of the external interface switching circuit as one of commands for the control circuit. When this switching command is inputted, the interface control circuit forms a control signal for controlling the interface switching circuit.

The bus interface circuit converts the levels of input/output signals in accordance with specifications of the semiconductor integrated circuit, sets timings, and controls a communication protocol. In conventional semiconductor integrated circuits, a test interface circuit of different specifications has been designed for each semiconductor integrated circuit, whereas according to the means mentioned above, it is unnecessary to design a test interface circuit of different specifications for each semiconductor integrated circuit. Further, with respect to a scan path, only a path is required for connecting the input/output terminals of each function module to the external interface switching circuit during a test operation. For this reason, either a scan path or a test pattern need not be created again for each semiconductor integrated circuit, as is the case with conventional semiconductor integrated circuits which implement a shift scan method. It is therefore possible to largely reduce a developing period for a semiconductor integrated circuit.

Also, since the external interface switching circuit connects the test input/output terminals of the module to the external terminal during a test operation, each module can be tested without increasing the number of external terminals. Further, the flexibility can be increased when a JTAG interface control circuit defined in IEEE1149.1 standard is utilized as the interface control circuit, thereby facilitating the test as well as the designing of the semiconductor integrated circuit.

Also, while the present invention discloses a JTAG interface in accordance with IEEE1149.1 standard as an example, a dedicated interface control circuit having similar functions may be used. Alternatively, these interface control circuits may not be provided, in which case a test command processable by a central processing unit is provided to implement a similar test function by this command or by a combination with a control register or the like.

BEST MODE FOR CARRYING OUT THE INVENTION

In the following, preferred embodiments of the present invention will be described with reference to the drawings.

Figure 1:
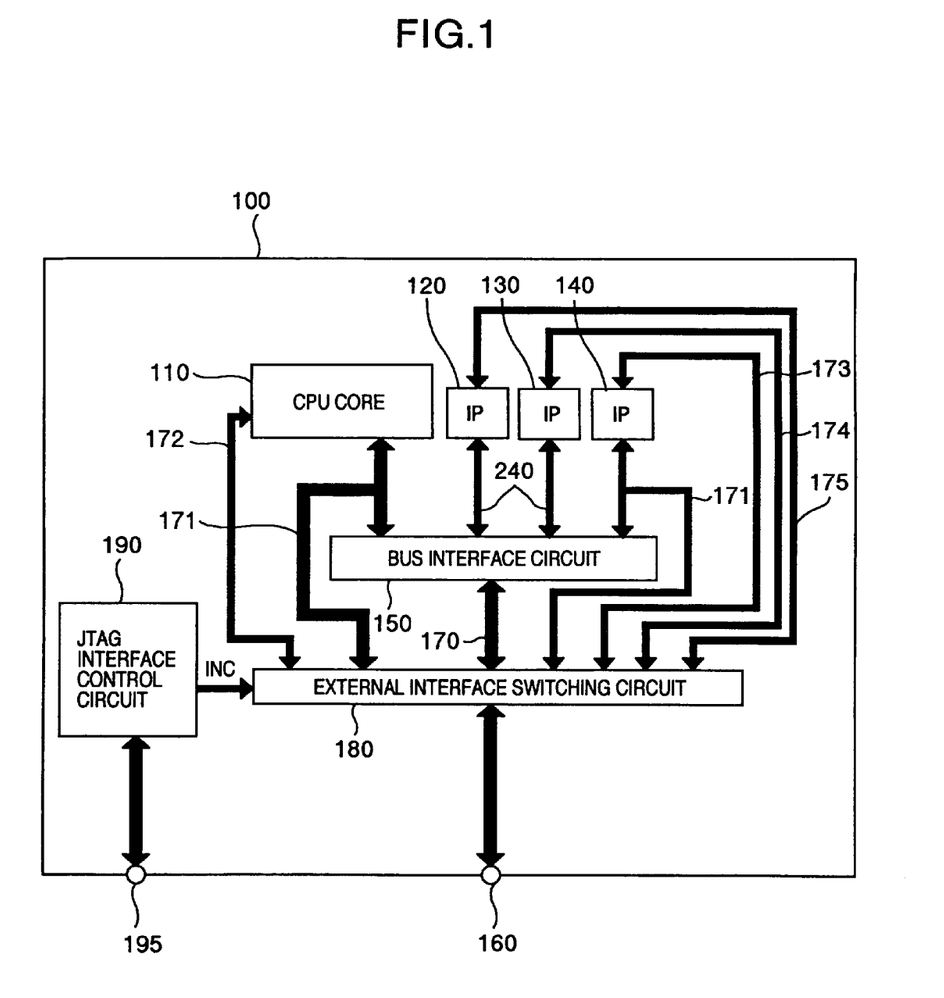
FIG. 1 is a block diagram of one embodiment of a semiconductor integrated circuit to which the present invention is suitably applied.

FIG. 1 is a block diagram of one embodiment of a system LSI as an exemplary semiconductor integrated circuit to which the present invention is applied, wherein the system LSI is fabricated on a single semiconductor chip 100 such as a single crystal silicon by known semiconductor integrated circuit manufacturing technologies.

FIG. 1 illustrates, as an exemplary system LSI, a general configuration of a microprocessor or a single-chip microcomputer to which the present invention is applied.

Reference numerals 110–140 in FIG. 1 designate function modules which are formed on the semiconductor chip 100 and constitute a system having desired functions; 150, a bus interface circuit for inputting/outputting signals between these modules and external devices provided external to the semiconductor chip 100; and 160, a plurality of external terminals for inputting/outputting signals. An external bus is connected to the external terminals 160.

Function modules which constitute a microprocessor or a single-chip microcomputer may be, in addition to a central processing unit (CPU core) for decoding instructions of a program to execute corresponding processing and operations, a read only memory ROM for storing programs and fixed data; a random access memory RAM for providing a work area for the CPU and a primary storage area for data; a bus controller responsible for management of an access right to the bus, and the like; and peripheral circuit modules (IP) such as a serial communication interface, a timer circuit, a DMA (direct memory access) controller, a digital-to-analog converter circuit, and an analog-to-digital converter circuit. In FIG. 1, 110 designates a CPU core; and IPs 120–140, the foregoing peripheral circuit modules.

The system LSI of this embodiment comprises between the respective function modules 110–140 and the bus interface 150 and external terminals 160, an inherent signal bus 170 for the bus interface circuit 150; a direct-coupled bus 171 for permitting direct input/output of signals to the respective function modules 110–140; an external interface switching circuit 180 for switching scan paths 172, 173, 174, 175 for shift scan, provided for each of the function modules; and an interface control circuit 190 for forming a switching control signal for the external interface switching circuit 180. The scan paths 172–175 each include a test data input wire (scan-in path) for inputting test data, and a test data output wire (scan-out path) for outputting the test data.

As described in connection with FIG. 7, the interface control circuit 190 is coupled to a plurality of external terminals 195 for test mode control signals TCK, TRST, TMS, a test data input signal TDI, and a test data output signal TDO. The control circuit 190, for which a JTAG (Joint Test Action Group) interface control circuit is used as defined in IEEE1149.1 standard, is provided with a switching command for switching the external interface switching circuit 180 as one command for the control circuit. The interface control circuit 190 is configured to be responsive to the switching command inputted thereto from the external terminal 195 to form an interface switching control signal INC for controlling the external interface switching circuit 180.

It should be noted that in FIG. 1, a logic circuit having a logic function required by the user (so-called user logic circuit) may be mounted as a module, other than the aforementioned modules. Also, the scan path provided for each module 110–140 is not limited to one, but a number of paths required by each module may be provided. When a plurality of scan paths are provided, the external interface switching circuit 180 will switch interfaces for the respective scan paths. If there is a number of the external terminals 160 larger than the number of scan paths, these scan paths can be tested simultaneously.

Figure 2:
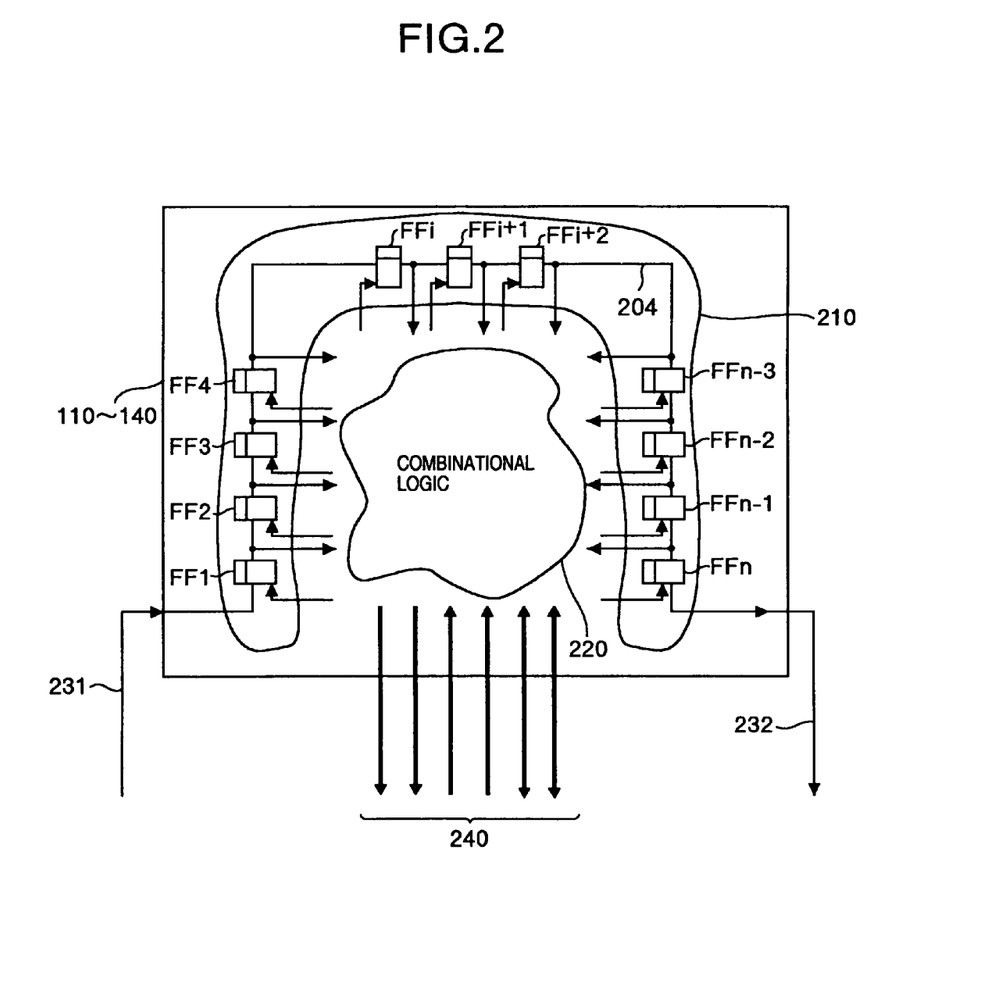
FIG. 2 is a conceptual diagram illustrating a general configuration of a function module which forms part of the semiconductor integrated circuit.

FIG. 2 schematically illustrates each of the function modules 110–140, which constitute the system LSI illustrated in FIG. 1, centered on its logic configuration.

As illustrated in FIG. 2, each function module 110–140, which includes latch circuits or flip-flop circuits, is comprised of a sequential circuit 210 which has an output at a certain point in time that is not determined only by an input signal at that time but is determined by the input signal and the preceding internal state; and a combinational circuit 220 such as a decoder, a processor or the like, which has an output at a certain point in time that is determined only by an input signal at that time. In FIG. 2, those designated reference letters FF1–FFn are flip-flops which constitute logics of the sequential circuit 210 and can also build a shift register for scan path.

FIG. 2 illustrates that the flip-flops FF1–FFn are assembled into a shift register for scan path. Reference numeral 231 designates a scan-in path for test data into the shift register; 232, a scan-out path for data from the shift register; and 240, inherent input/output signals of the modules 110–140. While the input/output signals 240 may be inputted to or outputted from the combinational circuit 220, they are generally inputted to the sequential circuit 210 which operates in synchronism with a clock signal, and the output signals are often latched into the flip-flops and outputted at a predetermined timing. The scan-in path 231 and scan-out path 232 are regarded as constituting any of the scan paths 171–175 in FIG. 1.

Figure 3:
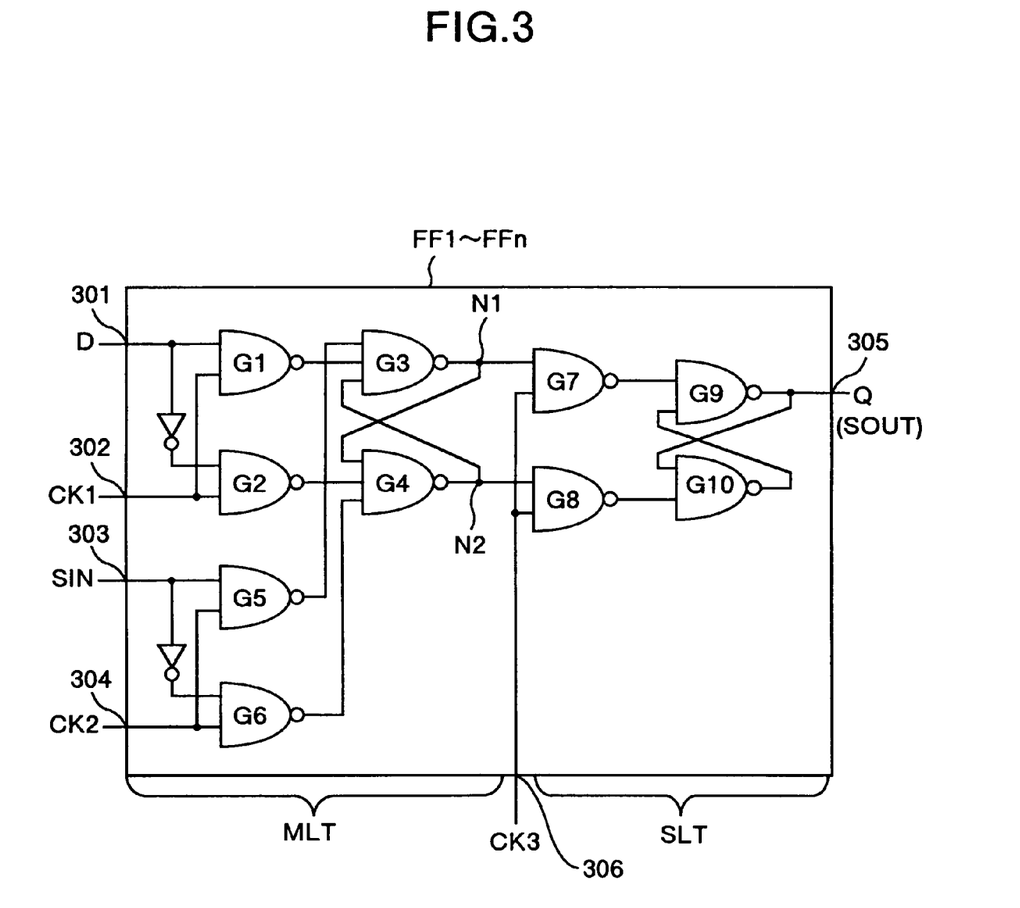
FIG. 3 is a logic schematic diagram illustrating a specific example of flip-flop which can comprise a shift register for a shift-scan based test.

FIG. 3 illustrates a specific example of the flip-flop FF1–FFn. As illustrated in the figure, each flip-flop is in a double latch configuration comprised of a master latch MLT and a slave latch SLT.

Out of them, the master latch MLT comprises two data input terminals 301, 303; an input terminal 302 for a clock CK1 which gives a data latch timing to the data input terminal 301; and an input terminal 304 for a clock CK2 which gives a data latch timing to the data input terminal 303. The master latch MLT is comprised of NAND gates G1, G2 which receive a data signal D inputted to the data terminal 301 and an inverted signal thereof as well as the clock signal CK1 inputted to the clock terminal 302; NAND gates G5, G6 which receive a data signal SIN inputted to the data terminal 303 and an inverted signal thereof as well as the clock signal CK2 inputted to the clock terminal 304; and NAND gates G3, G4 which receive output signals of these NAND gates G1, G2, G5, G6 and have their output terminals cross-coupled to one input terminal of the other gate.

The master latch MLT receives at the data input terminal 301 the signal D from a logic gate at a former stage which forms part of an internal logic circuit, and receives at the data input terminal 303 the signal SIN from a flip-flop at a former stage which forms part of a scan path.

On the other hand, the slave latch SLT comprises two data input terminals connected to output nodes N1, N2 of the master latch MLT; a clock terminal 306 which gives a data latch timing to the input data terminals; and one data output terminal 305. Then, the slave latch SLT is comprised of AND gates G7, G8 which receive an output signal of the master latch MLT and a clock signal CK3 inputted to the clock terminal 306; and NAND gates G9, G10 which receive output signals of these NAND gates G7, G8 and have their output terminals cross-connected to one input terminal of the other gate.

The slave latch SLT has an output terminal 305 commonly connected to an input terminal of a logic gate at a latter stage, which forms part of an internal logic circuit**, and to a data input terminal of a flip-flop at a latter stage, which forms part of a scan path. Though connected in this way, it is possible to avoid fetching a signal from the flip-flop at the former stage on the scan path into the master latch MLT during a normal operation by giving either the clock CK1 or CK2 to the master latch MLT at an appropriate timing.

While the flip-flop illustrated in FIG. 3 commonly has a signal output terminal Q during a normal operation and a signal output terminal SOUT during a scan test, it goes without saying that the output terminals may be separately provided.

Figure 4:
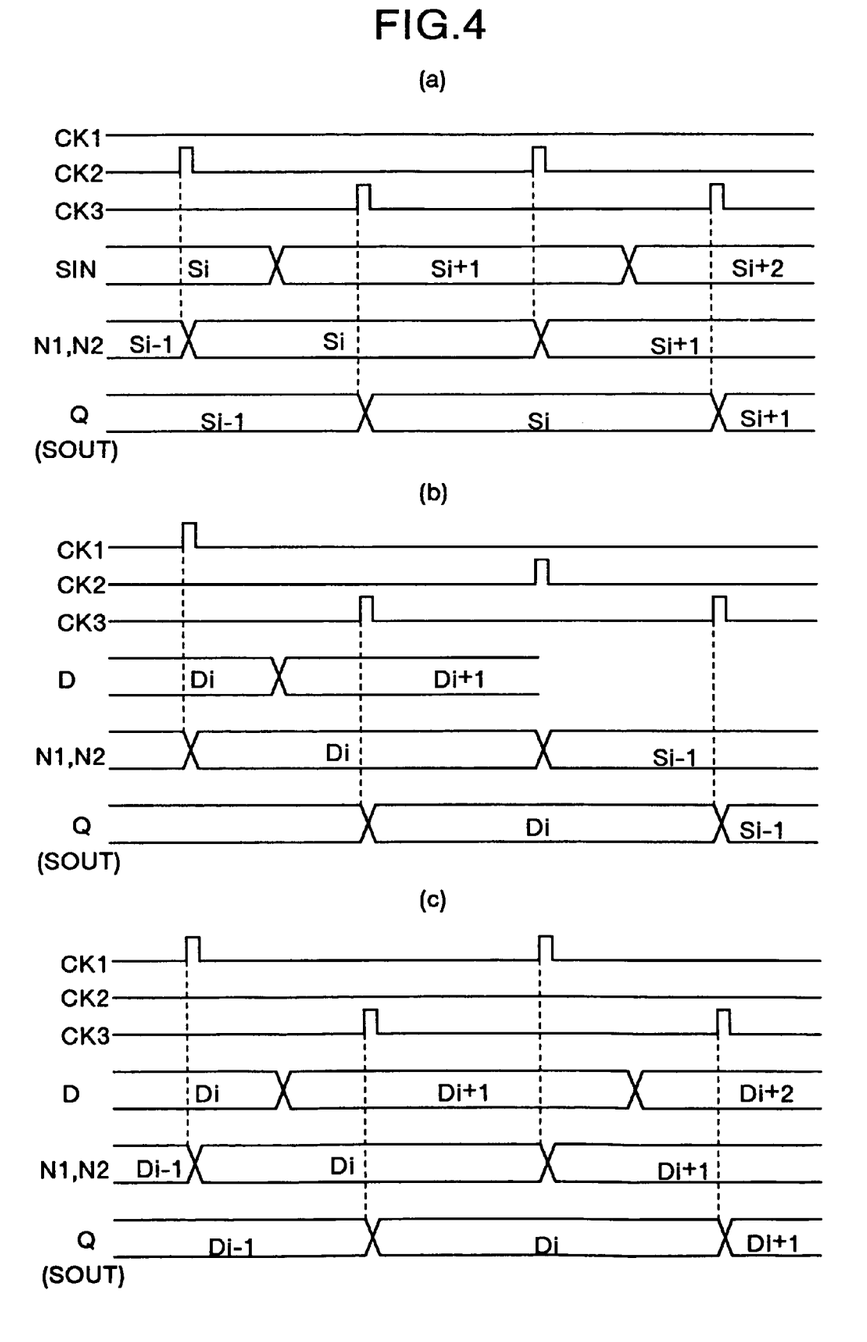
FIG. 4 is a timing chart showing operation timings of a flip-flop for shift scan.

FIG. 4(a) shows timings of each of the clock signals CK1–CK3 and the data signal SIN when test data is scanned into a flip-flop FFi (i=1–n) constituting an internal scan path to supply the test data to an internal logic circuit; FIG. 4(b) shows timings of each of the clock signals CK1–CK3 and the data signal D when an output (data D) of a logic gate within the internal logic circuit is fetched into a flip-flop FFi, and the fetched data is scanned out; and FIG. 4(c) shows timings of each of the clock signals CK1–CK3 and the data signal D when an output of a logic gate at a former stage is fetched into a flip-flop FFi and outputted to a logic gate at the next gate during a normal operation.

When test data is scanned into a flip-flop from the scan path, the data SIN at the input terminal 303 for scan-in data is first fetched into the master latch MLT by the clock CK2 before the data held in the master latch MLT is transferred to the slave latch SLT by the clock CK3, as shown in FIG. 4(a). By repeating this, the test data is sequentially shifted through the flip-flops FF1–FFn on the scan path.

As the test data has been scanned in, the data is inputted to an inherent logic circuit, the output of which is changed. As shown in FIG. 4(b), the output D is fetched into the master latch MLT from the data input terminal 301 by the clock CK1, before the data held by the master latch MLT is transferred to the slave latch SLT by the clock CK3. In this way, the output of the logic gate within the internal logic circuit can be fetched into the flip-flops through the data input terminal 301.

Next, the data fetched into the flip-flops FF1–FFn are shifted along the scan path by again applying the clocks CK2 and CK3 alternately to the flop-flops FF1–FFn. In this way, the result of operation by the internal logic circuit based on the scan-in data can be outputted to an external terminal through the scan path.

On the other hand, during a normal operation, a logic operation can be performed by repeatedly fetching the data at the data input terminal D at the timing shown in FIG. 4(c) and transferring the data from the master latch MLT to the slave latch SLT.

Figure 5:
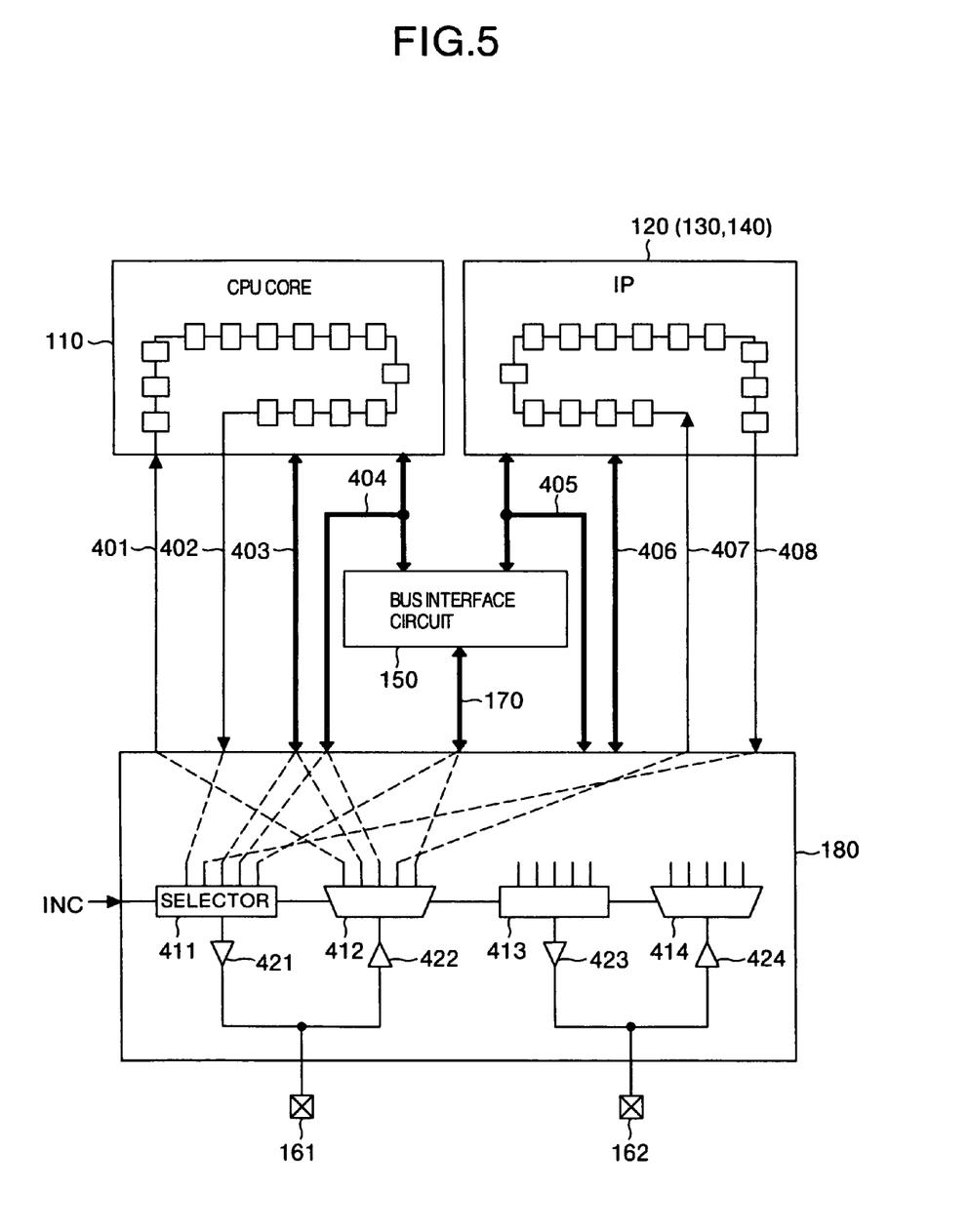
FIG. 5 is a general schematic diagram representing a relationship between the configuration of an external interface switching circuit and a function module.

FIG. 5 is a specific example of the external interface switching circuit 180 illustrated in FIG. 1.

The external interface switching circuit 180 is comprised of a plurality of selectors. While FIG. 5 shows four selectors 411–414 corresponding to two external terminals 161, 162, the number of selectors is not limited to four. Since the external terminals 161, 162 shown in FIG. 5 are terminals shared by inputs and outputs, two selectors are provided for each of the external terminals. For a terminal dedicated to input or dedicated to output, one selector is provided.

During a test, the selector 411 is provided for selectively coupling:

(1) a test result output signal (scan-out signal) from a scan-out path (test signal output wire) 402 connected to the module 110 (CPU core);

(2) a test result output signal (scan-out signal) from a scan-out path (test signal output wire) 408 coupled to each module 120 (130, 140); or (3) an output signal not through the bus interface circuit 150 within an output signal from a signal wire 403 coupled to the module 110 and a signal wire 404 coupled to the module 110, to the external terminal 161 in response to a switching control signal INC.

During a normal operation, on the other hand, the selector 411 is provided for outputting a normal output signal from a normal signal wire 170 coupled to the bus interface circuit 150 to the external terminal 161.

During a test, the selector 412 is provided for selectively supplying a test input signal fed from the external terminal 161 to:

(4) a scan-in path (test signal input wire) 401 coupled to the module 110 (CPU core) as a scan-in signal;

(5) a scan-in path (test signal input wire) 407 coupled to the module 120 (130, 140) as a scan-in signal; or (6) the signal wire 403 coupled to the module 110 and the signal wire 404 coupled to the module 110 as a test signal.

During a normal operation, on the other hand, the selector 412 is provided for inputting a normal input signal inputted from the external terminal 161 to the normal signal wire 170 coupled to the bus interface circuit 150.

Therefore, as illustrated in FIG. 5, scan-in paths and scan-out paths for a plurality of function modules may be connected to the selectors 411 and 412, or a scan-in path and a scan-out path for a single function module may be connected to them.

The selectors 413 and 414 are provided for the external terminal 162, and are coupled to the function module 130 or 140 other than the function modules 110 and 120.

Though not shown in FIG. 5 for avoiding complexity, the selectors 413 and 414 are configured in the following manner.

Specifically, during a test, the selector 413 is provided for selectively outputting (7) a test result output signal (scan-out signal) from a scan-out path (test signal output wire) coupled to the module 130 or 140); or (8) an output signal not through the bus interface circuit 150 within an output signal selected from a signal wire coupled to the module 110, 120, 130 or 140 (normal signal wire corresponding to 403, 406 or the like), and a signal wire coupled to the module 110, 120, 130 or 140 (signal wire corresponding to 404, 405 or the like), to the external terminal 162.

During a normal operation, on the other hand, the selector 413 is provided for coupling a normal output signal from the normal signal wire 170 coupled to the bus interface circuit 150 to the external terminal 162. Specifically, in this event, the selector 413 assigns a signal output function to the external terminal 162 to satisfy a function in a normal operation mode of the semiconductor integrated circuit in the embodiment. Therefore, the destination of the external terminal 162 is an arbitrary function module selected from the modules 110, 120, 130 and 140.

During a test, the selector 414 is provided for selectively supplying a test input signal inputted from the external terminal 162:

(9) to a scan-in path (test signal input wire) coupled to the module 130 or 140 as a scan-in signal; or (10) a normal input signal inputted from the external terminal 162 to a signal wire coupled to the module 110, 120, 130 or 140 (signal wire corresponding to 403, 406 or the like), and to a signal wire coupled to the module 110, 120, 130 or 140 (signal wire corresponding to 404, 405 or the like) as a test input signal.

During a normal operation, on the other hand, the selector 414 is provided for supplying a normal signal inputted from the external terminal 162 to the normal signal wire 170 coupled to the bus interface circuit 150. Specifically, in this event, the selector 414 assigns a signal input function to the external terminal 162 to satisfy a function in the normal operation mode of the semiconductor integrated circuit in the embodiment. Therefore, the destination of the external terminal 162 is an arbitrary function module selected from the modules 110, 120, 130 and 140.

In FIG. 5, 421 designates an output buffer circuit for supplying an output signal of the selector 411 to the external terminal 161; 422, an input buffer circuit for supplying a signal inputted from the external terminal 161 to the selector 412; 423, an output buffer circuit for supplying an output signal of the selector 413 to the external terminal 162; and 424, an input buffer circuit for supplying a signal inputted from the external terminal 162 to the selector 414.

The switching operations of selectors 411–414 are controlled by a plurality of switching signals INC from the JTAG interface control circuit 190. Five input/output modes can be achieved through the switching operations by the selectors 411–414, as illustrated in FIGS. 6(a)–6(e). In the following, each of the modes will be described.

Figure 6:
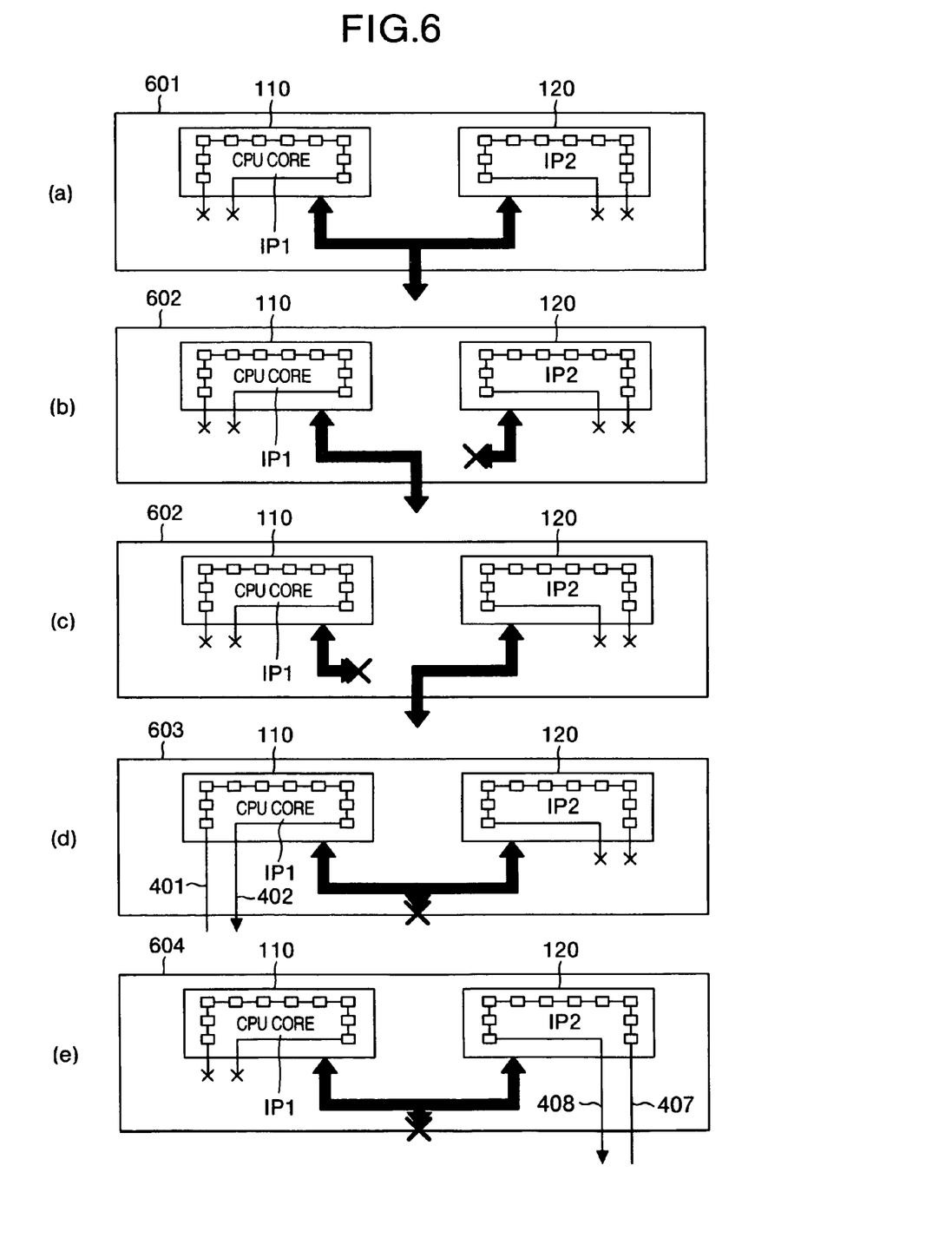
FIG. 6 is an explanatory diagram illustrating switching states of a signal bus (**path) in a semiconductor integrated circuit to which the present invention is applied.

(a) A normal operation mode in which input/output terminals of the module 110 (CPU core) and peripheral module 120 are connected to the external terminals 161, 162 through the bus interface circuit 150. This mode is achieved by normal operations of the selectors 411–414.

(b) A single CPU test mode in which the input/output terminals of the module 110 (CPU core) are directly connected to the external terminals 161, 162 to perform input/output operations for testing the function of the module. This mode is achieved by the operations (3), (6), (8), (10) and the like of the selectors 411–414.

(c) A single peripheral module test mode in which the input/output terminals of the peripheral module 120 (130, 140) are directly connected the external terminal 161 (162) to perform input/output operations for testing the function of the module. This mode is achieved by the operations (8) and (10) of the selectors 413 and 414.

(d) A CPU shift scan test mode in which the scan paths 401, 402 of the module 110 (CPU core) are directly connected to the external terminal 161 to scan in and scan out a test signal. This mode is achieved by the operations (1) and (5) of the selectors 411 and 412.

(e) A peripheral module shift scan test mode in which the scan paths 407, 408 of the peripheral module 120 (130, 140) are directly connected to the external terminals 161, 162 to scan in and scan out the test signal. This mode is achieved by the operations (2), (5), (7) and (9) of the selectors 411–414.

Figure 7:
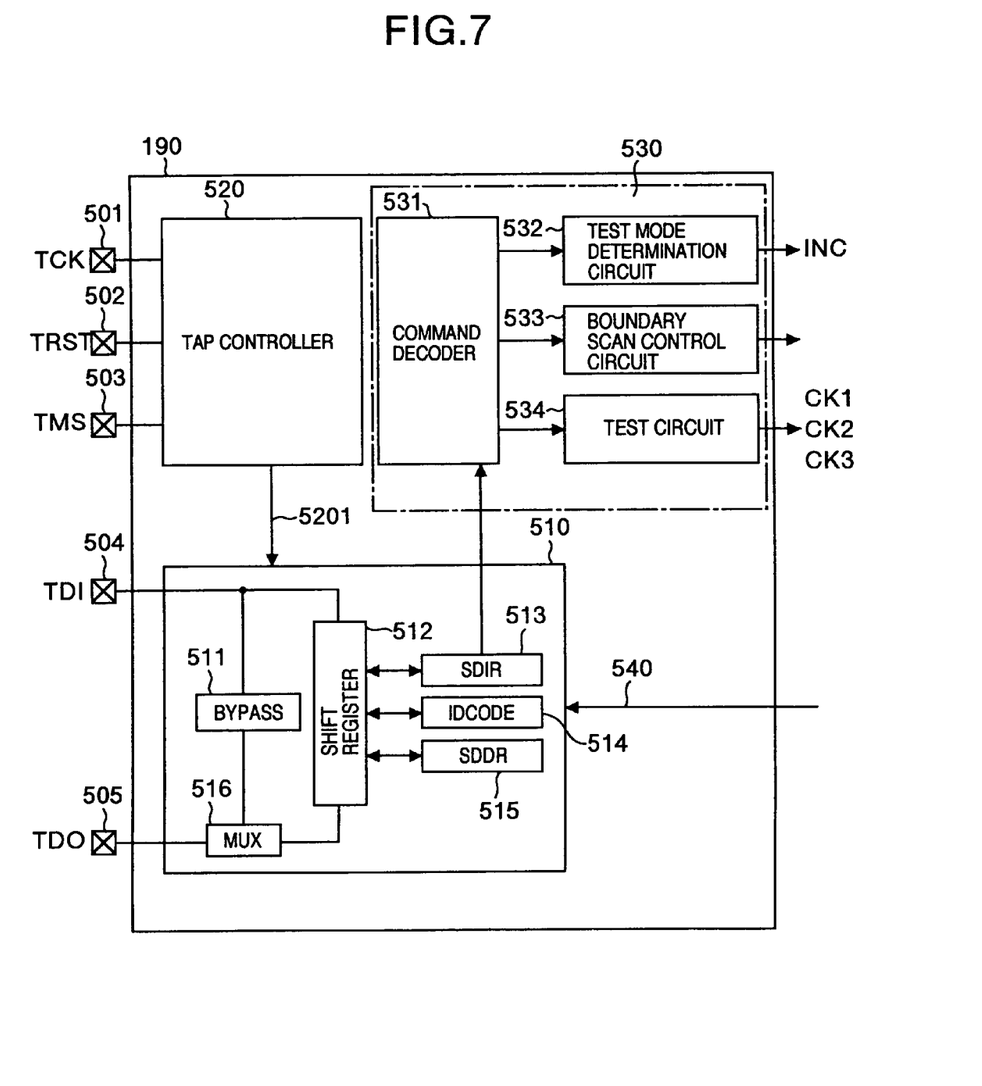
FIG. 7 is a block diagram illustrating an exemplary configuration of a JTAG interface control circuit.

FIG. 7 illustrates a specific example of the JTAG interface control circuit 190 shown in FIG. 1.

The JTAG interface control circuit 190 is a control circuit for achieving an interface for an internal shift scan test and a boundary scan test circuit defined by IEEE1149.1 standard. The control circuit 190 is comprised of a command data input/output circuit 510 which serves as TAP (Test Access Port) for fetching test data and commands serially inputted from the outside and serially outputting test result data from a module within the chip; a TAP controller 520 for controlling the input/output circuit 510; and a test control unit 530 for decoding an instruction (command) fetched by the command data input/output circuit 510 to conduct a test control corresponding to the instruction.

The TAP controller 520 is connected to three dedicated external terminals 501–503, and is configured to have the ability to receive a test mode select signal TMS for specifying a test mode, a test clock TCK, and an asynchronous reset signal TRST from these terminals 501–503, respectively. The TAP controller 520 forms a control signal 5201 for controlling registers 511–515 and a multiplexer 516 within the command data input/output circuit 510 based on the signal levels of these signals TMS, TCK and TRST. Though not particularly limited, the TAP controller 520 is configured to switch the test mode each time it receives one pulse of the test mode select signal TMS.

The command data input/output circuit 510 is comprised of a bypass register 511 used to shift test data from the input port terminal 504 to the output port terminal 505; a shift register 512 for serial-to-parallel converting input/output data; an instruction register (SDIR) 513 for storing a command for controlling an internal test method; a device ID register (IDCODE) 514 for setting a manufacturing identification number unique to the chip; a data register (SDDR) 515 used for transmitting a particular signal to each module; a multiplexer 516 (MUX) for switching paths of the bypass register 511 and shift register 512; and the like.

The command data input/output circuit 510 is also provided with an input terminal 504 for a command or data TDI, and an output terminal 505 for test result data TDO, so that the inputted test data TDI is supplied to each of the registers 513–515 through the shift register 512. Also, the command data input/output circuit 510 is configured to have the ability to store values from the respective modules within the chip in the registers 513–515 within the command data input/output circuit 510 through a signal line 540.

While the JTAG standard provides several essential instructions as instructions set in the instruction register 513, some optional instructions can be provided in addition. In this embodiment, a switching command is provided as one of the optional instructions for controlling or switching the external interface switching circuit 180. As this switching command is inputted to the command data input/output circuit 510 from the data input terminal 504, the command is stored in the instruction register 513 and decoded by the command decoder 531. A test mode determination circuit 532 determines from the result of decoding command data 531 the type of test mode and which of modules is tested, and outputs, for example, the switching control signal INC for the external interface switching circuit 180.

In addition to the command decoder 531 and test mode determination circuit 532, the test control unit 530 is provided with a boundary scan control circuit 533 for controlling a boundary scan path for testing communications of signals with other semiconductor integrated circuits; and a test circuit 534 for generating test clock signals such as the scan clock signals CK2, CK3 for the flip-flops (FIG. 3) constituting the scan path during a shift scan test, and the clock signal CK1 for fetching a monitor signal, and control signals.

Though not described in the embodiment of FIG. 1, for providing a semiconductor integrated circuit with a function of conducting a boundary scan test using the control function of the boundary scan control circuit 533, the external interface switching circuit 180 is provided therein, for example, with shift registers which constitute a boundary scan path.

Figure 8:
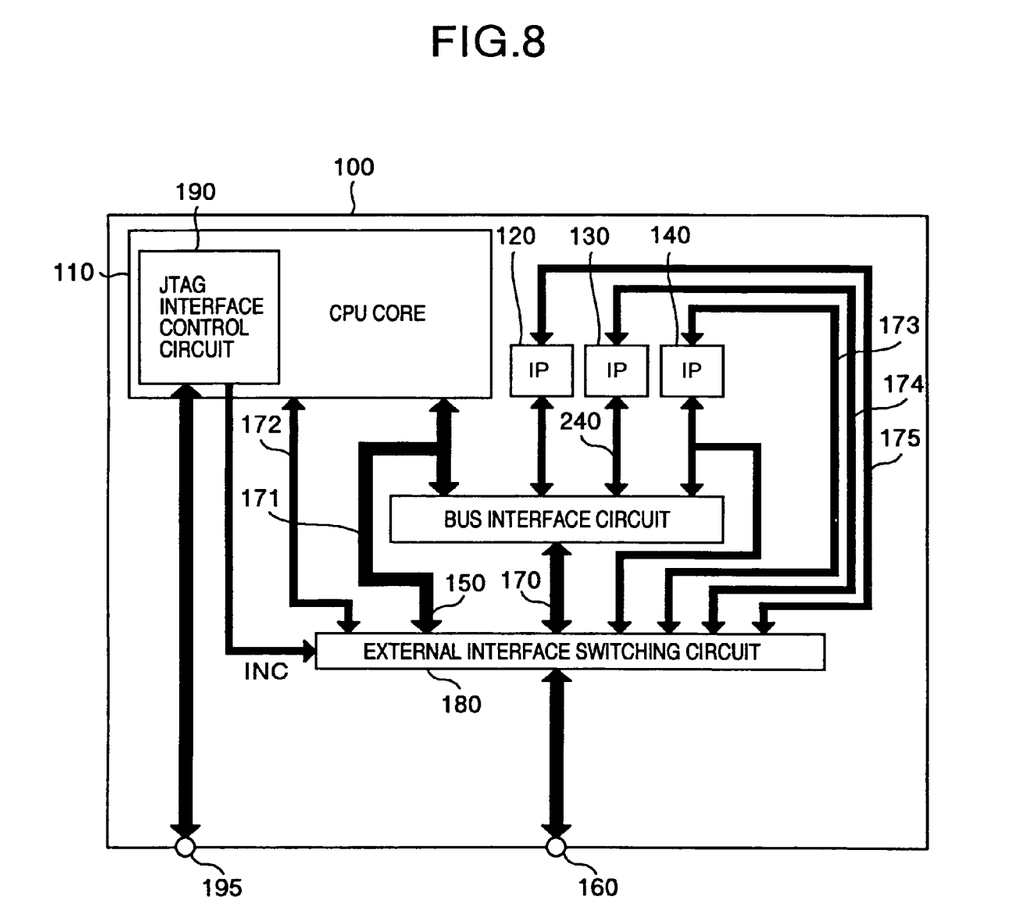
FIG. 8 is a block diagram illustrating another embodiment of the present invention.

FIG. 8 illustrates an exemplary modification to the aforementioned embodiment, where the JTAG interface control circuit 190 is integrally arranged in the module 110 (CPU core). With such a configuration, once such a module incorporating the interface control circuit is designed, the module may be registered in a database or the like, so that a time for designing an interface control circuit can be saved by using this module when another system LSI is to be developed. The module integrally provided with the interface control circuit is not limited to the CPU core, but may be an arbitrary peripheral module. Particularly when a system LSI is developed, a highly frequently used module is most preferable.

Figure 9:
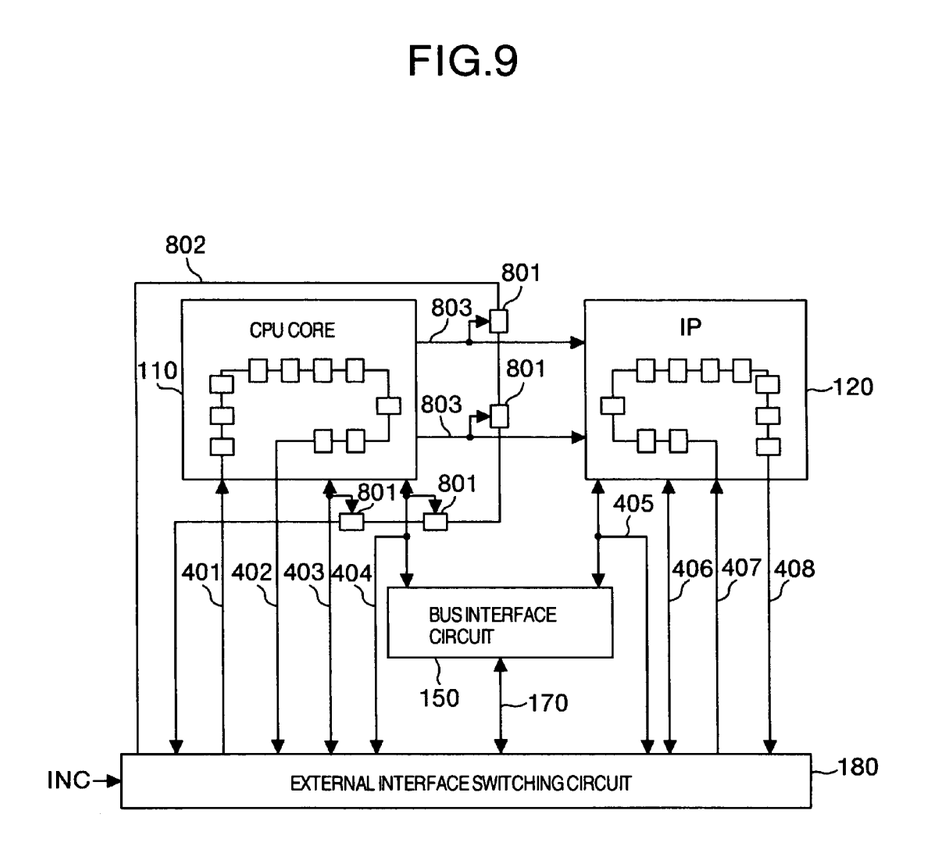
FIG. 9 is an explanatory diagram illustrating an exemplary method of observing signals between function modules in a semiconductor integrated circuit to which the present invention is applied.

FIG. 9 illustrates another embodiment of a system LSI to which the present invention is applied. This embodiment comprises, in addition to the scan paths (401, 402) within the modules, flip-flops 801 for latching signals associated with the modules, i.e., signals (403, 404) inputted and outputted to the modules through external terminals, and a signal (803) between modules. The flip-flops are connected in series to form a scan path (802) for scanning in a test signal and scanning out a monitor signal. The system LSI is configured such that this scan path can also be switched with other signal paths which are switched by the external interface switching circuit 180.

It should be noted that the scan path for the signals associated with the modules may be controlled using the function of the boundary scan control circuit 533 illustrated in FIG. 7. While a scan path within a module cannot monitor an output signal of a logic gate at a stage later than a flip-flop which forms part of the scan path, a more secure test can be conducted by providing a scan path which can monitor the signals associated with the modules as in FIG. 9. When this embodiment is applied in combination with the embodiment of FIG. 1, the flip-flops for latching signals on the signal paths 403, 404 in FIG. 9 may be omitted, and the system LSI may be provided with a scan path comprised of flop-flops for monitoring only signals between pure modules.

While the invention made by the inventors has been described in a specific manner with reference to embodiments, it goes without saying that the present invention is not limited to the foregoing embodiments but may be modified in various ways without departing from the spirit thereof. For example, in the foregoing embodiments, scan-in data is inputted from the external terminal 160 to each scan path through the external interface switching circuit 180 in a shift scan test. A circuit for generating a test signal such as a random pattern generator circuit may be provided within the chip, such that a test signal is inputted to each scan path from there.

Also, instead of the JTAG interface in accordance with IEEE1149.1 standard, a dedicated interface control circuit may be used for controlling the external interface switching circuit or the like, as an interface control circuit. Further, instead of having the interface circuit, test commands executable by the central processing unit may be previously incorporated such that the central processing unit or a test control circuit controls the external interface switching circuit or the like by executing the commands or by a combination with a control register or the like.

INDUSTRIAL APPLICABILITY

While the foregoing description has been made mainly on the invention made by the inventors taking as an example a microprocessor or a single-chip microcomputer which constitutes the background, the present invention is not limited to that, but may be widely utilized in LSIs which incorporate a plurality of modules.

EFFECTS OF THE INVENTION

In the following, effects produced by representative ones of inventions disclosed in this application will be described in summary.

Specifically, according to the present invention, it is possible to reduce a developing period for a system LSI which is configured using a plurality of function modules. Also, since the external interface switching circuit connects test input/output terminals of a module to external terminals during a test operation, each module can be tested without increasing the number of external terminals.

The invention claimed is:

1. A semiconductor integrated circuit comprising:

a test terminal serially supplied with a command;

a test control circuit coupled to said test terminal for supplying a control signal in response to said command;

a first function module including a first test data input terminal, a first test data output terminal, and a plurality of first signal terminals;

a second function module including a second test data input terminal, a second test data output terminal, and a plurality of second signal terminals;

a bus interface circuit including a first input coupled to said plurality of first signal terminals, and a second input coupled to said plurality of second signal terminals;

a switching circuit including a first selector having a first output coupled to said first test data input and a second output coupled to the first input of said bus interface circuit, a second selector having a first input coupled to said first test data output terminal and a second input coupled to the first output of said bus interface circuit, a third selector having a third output coupled to said second test data input terminal and a fourth output coupled to the second input of said bus interface circuit, and a fourth selector having a third input coupled to said second test data output terminal and a fourth input terminal coupled to the second output of said bus interface circuit;

a first external terminal coupled to an input of said first selector and an output of said second selector; and a second external terminal coupled to an input of said third selector and an output of said fourth selector, wherein said first selector connects said first output and said input of said first selector in response to a first state of said control signal, and connects said second output and said input of said first selector in response to a second state of said control signal;

said second selector connects said first input and said output of said second selector in response to said first state of said control signal, and connects said second input and said output in response to said second state of said control signal;

said third selector connects said third output and said input of said third selector in response to said first state of said control signal, and connects said fourth output and said input in response to said second state of said control signal; and said fourth selector connects said third input and said output of fourth selector in response to said first state of said control signal, and connects said fourth input and said output in response to said second state of said control signal.

* * * * *